(12) United States Patent
Zang et al.

(10) Patent No.: US 10,297,504 B2
(45) Date of Patent: May 21, 2019

(54) METHODS OF FORMING A GATE STRUCTURE-TO-SOURCE/DRAIN CONDUCTIVE CONTACT AND THE RESULTING DEVICES

(71) Applicant: GLOBALFOUNDRIES Inc., Grand Cayman (KY)

(72) Inventors: Hui Zang, Guilderland, NY (US); Keith Tabakman, Gansevoort, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/670,366

(22) Filed: Aug. 7, 2017

(65) Prior Publication Data

US 2019/0043758 A1    Feb. 7, 2019

(51) Int. Cl.
*H01L 21/283* (2006.01)
*H01L 21/311* (2006.01)
*H01L 21/768* (2006.01)
*H01L 21/8234* (2006.01)

(52) U.S. Cl.
CPC .... *H01L 21/823425* (2013.01); *H01L 21/283* (2013.01); *H01L 21/31144* (2013.01); *H01L 21/76808* (2013.01); *H01L 21/76816* (2013.01); *H01L 21/76895* (2013.01); *H01L 21/76897* (2013.01); *H01L 21/823418* (2013.01); *H01L 21/823437* (2013.01); *H01L 21/823468* (2013.01)

(58) Field of Classification Search
CPC .......... H01L 21/823425; H01L 21/283; H01L 21/31144; H01L 21/76808; H01L 21/76816; H01L 21/76895; H01L 21/76897; H01L 21/823418; H01L 21/823437; H01L 21/823468
See application file for complete search history.

(56) References Cited

U.S. PATENT DOCUMENTS

| | | | | |
|---|---|---|---|---|
| 5,587,338 A | * | 12/1996 | Tseng | ................ H01L 21/76877 257/E21.585 |
| 6,271,087 B1 | * | 8/2001 | Kinoshita | ......... H01L 21/31144 257/E21.257 |
| 6,750,107 B1 | | 6/2004 | Violette | |
| 8,503,221 B1 | | 8/2013 | Hobson et al. | |
| 2011/0062501 A1 | * | 3/2011 | Soss | .................. H01L 21/28114 257/288 |
| 2011/0278676 A1 | * | 11/2011 | Cheng | ............. H01L 21/823807 257/369 |

(Continued)

*Primary Examiner* — Joseph M Galvin, III
(74) *Attorney, Agent, or Firm* — Amerson Law Firm, PLLC

(57) ABSTRACT

Various novel methods of forming a gate-to-source/drain conductive contact structure and the resulting novel device structures are disclosed. One illustrative method disclosed herein includes performing at least one first etching process to form a recess in a gate structure of a gate of a transistor device so as to expose an innermost surface of a portion of a sidewall spacer positioned adjacent a first sidewall of the gate structure and performing at least one second etching process through at least the recess in the gate structure so as to remove at least a portion of the portion of the sidewall spacer with the exposed innermost surface.

19 Claims, 5 Drawing Sheets

(56) References Cited

U.S. PATENT DOCUMENTS

2011/0298017 A1* 12/2011 Jain .................. H01L 21/76897
　　　　　　　　　　　　　　　　　　　　　　257/288
2015/0179571 A1*　6/2015 Pu ..................... H01L 21/76879
　　　　　　　　　　　　　　　　　　　　　　257/751

* cited by examiner

METHODS OF FORMING A GATE STRUCTURE-TO-SOURCE/DRAIN CONDUCTIVE CONTACT AND THE RESULTING DEVICES

BACKGROUND OF THE INVENTION

1. Field of the Invention

The present disclosure generally relates to the fabrication of semiconductor devices, and, more particularly, to various novel methods of forming a gate structure-to-source/drain conductive contact structure and the resulting novel device structures.

2. Description of the Related Art

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art 6T (six transistor) SRAM memory cell 10 that includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form inverters having a conventional configuration. The source regions (S) of the PMOS pull-up transistors PU1, PU2 are connected to a high reference potential, typically VDD, and the source regions (S) of the NMOS pull-down transistors PD1, PD2 are connected to a lower reference potential, typically VSS or ground. The PMOS pull-up transistor PUI and the NMOS pull-down transistor PD1 make up one inverter of the SRAM cell 10. The PMOS pull-up transistor PU2 and the NMOS pull-down transistor PD2 make up the other inverter of the SRAM cell 10.

The gate 14A of the PMOS pull-up transistor PUI and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

In manufacturing such an SRAM cell 10, a conductive contact structure must be formed to cross-couple (or connect) a shared source/drain region on the first inverter with a gate structure of the second inverter. Such cross-coupled contact structures may also be formed on other IC devices and in different applications than the above-described SRAM cell 10. The present disclosure is directed to various novel methods of forming a gate structure-to-source/drain conductive contact structure and the resulting novel device structures for various types of IC devices and products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate structure-to-source/drain conductive contact and the resulting novel device structures. One illustrative method disclosed herein includes performing at least one first etching process to form a recess in a gate structure of a gate of a transistor device so as to expose an innermost surface of a portion of a sidewall spacer positioned adjacent a first sidewall of the gate structure and performing at least one second etching process through at least the recess in the gate structure so as to remove at least a portion of the portion of the sidewall spacer with the exposed innermost surface.

One illustrative device disclosed herein includes a gate positioned above a semiconductor substrate, the gate comprising a gate structure, a gate cap positioned above the gate structure and a sidewall spacer positioned adjacent sidewalls of the gate structure, and a recess in the gate structure, the recess having a lowermost surface that is at a level that is below a level of an uppermost surface of the gate structure. In this example, the device also includes a source/drain region positioned adjacent the gate and a gate structure-to-source/drain conductive contact structure that conductively couples the gate structure to the source/drain region, a portion of the gate structure-to-source/drain conductive contact structure extending into the recess in the gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
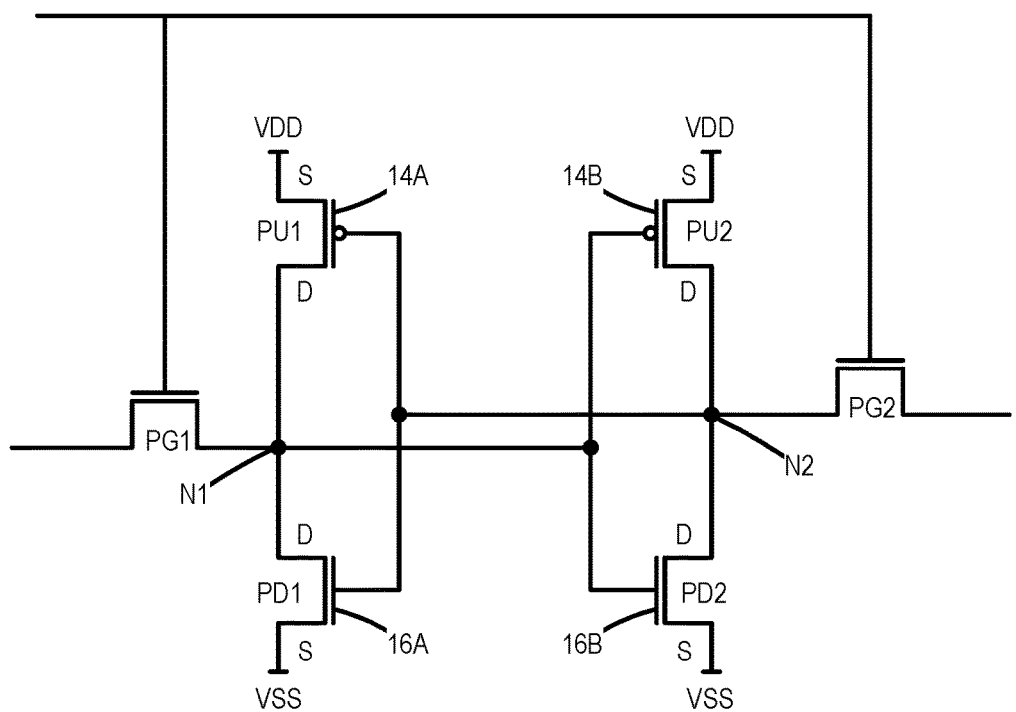
FIG. 1 is an electrical schematic of an illustrative prior art SRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming a gate structure-to-source/drain conductive contact structure (which also may be referred to herein as a cross-coupled contact), and the resulting novel device structures. As will be appreciated by those skilled in the art after a complete reading of the present application, the methods disclosed herein may be employed to form a gate structure-to-source/drain conductive contact structure in a variety of different applications. For example, the methods disclosed herein may be employed to form a gate structure-to-source/drain conductive contact structure on a SRAM device, like the one described in the background section of this application. Other applications where such cross-coupled contact structures may be employed include, but are not limited to, various devices that are typically found in the logic portion of an IC product, etc. Thus, the inventions disclosed and claimed herein should not be considered to be limited to any particular application where such cross-coupled contacts may be formed. With reference to the attached figures, various illustrative embodiments of the methods and devices disclosed herein will now be described in more detail. The methods disclosed herein may be employed to form cross-coupled contacts to the gate structure of any type of transistor device, such as planar transistor devices, FinFET devices, vertical transistor devices, etc. The present disclosures refer to the illustrative case where an integrated circuit (IC) product 100 is manufactured using FinFET transistor devices. However, the inventions disclosed herein should not be considered to be limited to any particular form of transistor device on any particular type of IC product.

Figure 2:
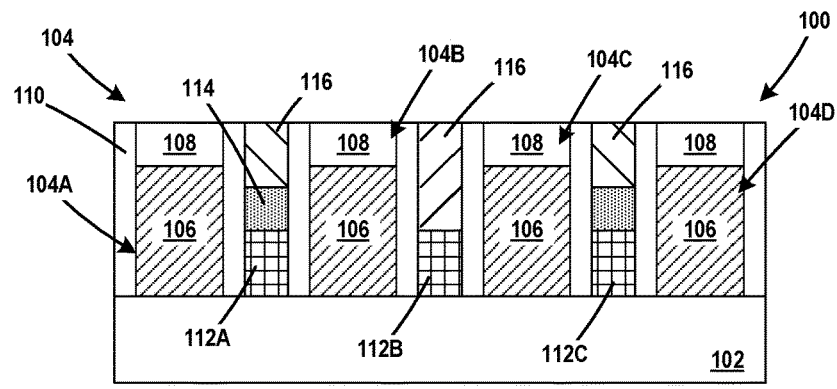
FIGS. 2-11 are cross-sectional views that depict various novel methods of forming a gate structure-to-source/drain conductive contact structure and the resulting novel device structures.

FIGS. 2-11 are various views that depict the multiple novel methods disclosed herein for forming a gate structure-to-source/drain conductive contact structure and the resulting novel device structures. FIG. 2 is a cross-sectional view that depicts four illustrative gates 104A-D (generally referenced using the numeral 104) of the IC product 100 that are formed above a semiconductor substrate (or fin) 102. Each of the gates 104 generally comprises a simplistically depicted gate structure 106, a gate cap 108 and a sidewall spacer 110. The gate structure 106 typically includes a gate insulation layer (not separately shown) such as silicon dioxide, a high-k insulation material (k value of 10 or greater), etc., and one or more conductive material layers (not separately shown), such as one or more metal layers that function as the conductive gate electrode for the transistor devices. However, as will be appreciated by those skilled in the art after a complete reading of the present application, the presently disclosed inventions should not be considered to be limited to gate structures 106 of any specific form, structure or material composition. The gate caps 108 and the sidewall spacers 110 may be made of a variety of different materials, e.g., silicon nitride, SiBCN, etc.

Also depicted in FIG. 2 are three illustrative regions of epi semiconductor material 112A-C (generally referenced using the numeral 112) that are formed between the gates 104. In the example depicted herein, a cross-coupled conductive contact structure will be formed between the gate structure 106 of the gate 104B and the epi semiconductor material 112A, while a separate cross-coupled conductive contact structure will be formed between the gate structure 106 of the gate 104C and the epi semiconductor material 112C. Of course, as will be appreciated by those skilled in the art after a complete reading of the present application, in some embodiments, the epi semiconductor regions 112 may not be formed adjacent the gates 104. In such a situation, the cross-coupled conductive contact structure may be formed so as to be conductively coupled to the substrate 102 (where the source/drain region is formed) and the gate structure 106.

In one illustrative example, where the IC product 100 comprises an SRAM device, the gate 104A extends across first and second transistor devices (one an N-type and the other a P-type device) of the SRAM cell. That is, the epi semiconductor material 112A is a shared epi semiconductor region that is coupled to the source/drain regions of the first and second transistor devices. The gate structure 106 of the gate 104B controls a separate transistor device of the SRAM cell, a transistor device that is different from the first and second transistor devices. Similarly, the gate 104D extends across third and fourth transistor devices (one an N-type and the other a P-type device) of the SRAM cell. The epi semiconductor material 112C is also a shared epi semiconductor region that is coupled to the source/drain regions of the third and fourth transistor devices. The gate structure 106 of the gate 104C controls a separate transistor device of the SRAM cell 100, a transistor device that is different from the third and fourth transistor devices.

In the example depicted herein, the source/drain contact structures for the various source/drain regions of all of the devices will be depicted as being formed using a self-aligned contact (SAC) process. Accordingly, FIG. 2 also depicts a region of sacrificial amorphous silicon 114 and a sacrificial insulation material 116 (e.g., silicon dioxide) that were formed above the epi semiconductor regions 112. In the embodiment where the epi semiconductor regions 112 are not formed, the sacrificial amorphous silicon material 114 would be formed on the substrate (fin) 102. These sacrificial materials 114, 116 may be formed using the following illustrative process flow. First, a layer of amorphous silicon may be deposited above the epi semiconductor regions 112 (and/or the source/drain regions of the various transistor devices if the epi semiconductor regions 112 are not formed) so as to overfill the openings between the gates 104. Thereafter, a CMP process may be performed using the gate caps 108 as a polish-stop so as to remove excess amounts of the amorphous silicon material. At that time, a recess etching process may be performed on the amorphous silicon material to reduce its thickness. Then, a layer of the insulating material 116 may be deposited above the amorphous silicon regions 114 so as to overfill the remaining portions of the openings between the gates 104. Thereafter, another CMP process may be performed using the gate caps 108 as a polish-stop so as to remove excess amounts of the insulating material 116. Of course, as will be appreciated by those skilled in the art after a complete reading of the present application, the contacts to the epi semiconductor regions 112, i.e., the source/drain regions, may be formed using any desired technique other than the illustrative SAC process described above. For example, in some cases only the insulating material 116 may be formed above the epi semiconductor regions 112. In some application, it may not be necessary to form the epi semiconductor regions 112 above the source/drain regions of the transistor devices.

Figure 3:
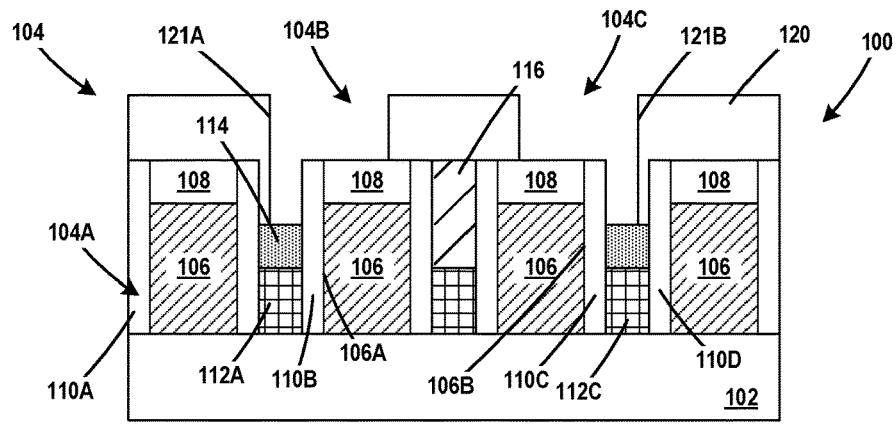

FIG. 3 depicts the IC product 100 after several process operations were performed. First, an etching process was performed to remove the regions of insulating material 114 selectively relative to the surrounding materials. This process exposes the regions of amorphous silicon 114 between the gates 104. Thereafter, a patterned masking layer 120 comprised of openings 121A, 121B (generally referenced using the numeral 121) was formed above the IC product 100. The patterned masking layer 120 may be comprised of a variety of different materials, e.g., SOH. The opening 121A exposes an area where various materials will be removed such that a first cross-coupled conductive contact structure may be formed between the gate 104B and the adjacent source/drain region, i.e., the epi semiconductor region 112A in the depicted example. The opening 121B exposes an area where various materials will be removed such that a second cross-coupled conductive contact structure may be formed between the gate 104C and the adjacent source/drain region, i.e., the epi semiconductor region 112C in the depicted example. In one illustrative example, the openings 121 may have a generally rectangular-shaped configuration when viewed from above. Note that the opening 121A only exposes a portion of the axial length (in the gate width direction of the transistor devices (a direction that runs into and out of the plane of the drawing page)) of the part of the spacer 110B positioned adjacent only one side 106A of the gate structure 106 of the gate 104B. Similarly, the opening 121B only exposes a portion of the axial length (in a gate width direction of the transistor devices (that runs into and out of the plane of the drawing page)) of the part of the spacer 110C positioned adjacent only one side 106B of the gate structure 106 of the gate 104C. The masking layer 120 is formed so as to specifically protect all other areas of the spacers 110 formed on all of the devices, and particularly, the spacers 110A and 110D that are positioned laterally adjacent the spacers 110B and 110C, respectively.

Figure 4:
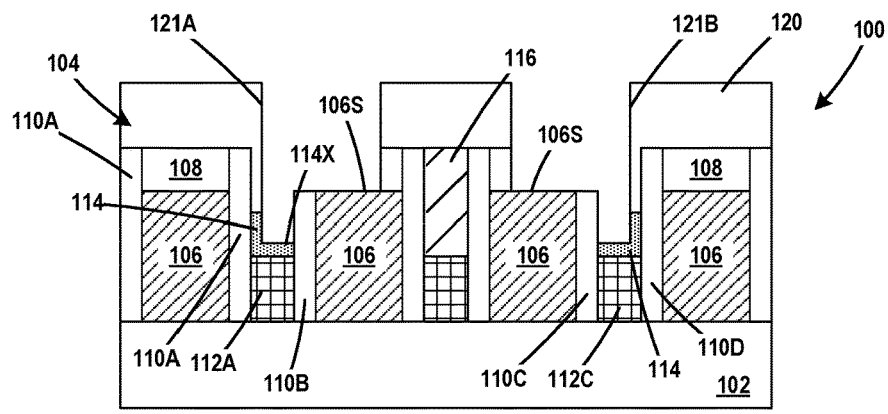

FIG. 4 depicts the IC product 100 after one or more processes were performed through the patterned masking layer 120. In one illustrative process flow, a first etching process may be performed to remove portions of the amorphous silicon regions 114 so as to form a recess 114X in the amorphous silicon regions 114. The amount of recessing of the amorphous silicon regions 114 may vary depending upon the particular application. Thereafter, one or more gate cap etching processes were performed though the masking layer 120 to remove the portions of the gate caps 108 and the vertical portions of the spacers 110B, 110C exposed by the openings 121A, 121B, respectively. These process operations expose portions of the gate structures 106 within the openings 121. Removal of the gate caps 108 exposes at least a portion of an upper surface 106S of the gate structures 106.

Figure 5:
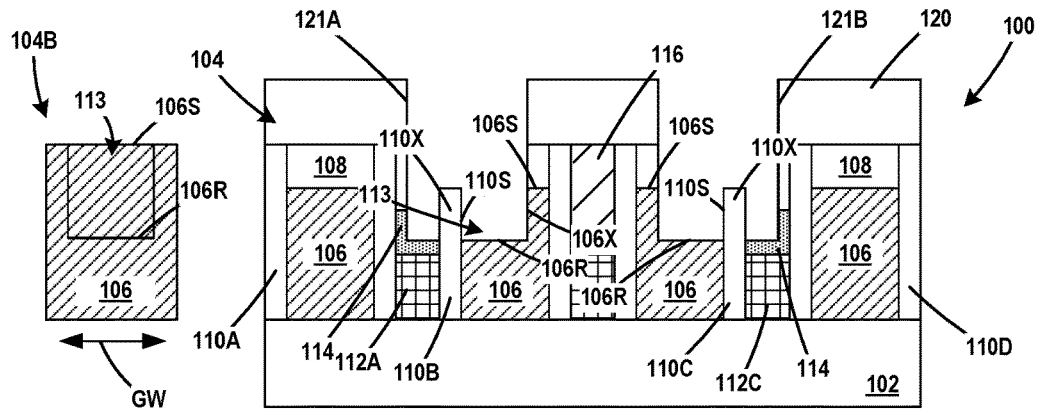

FIG. 5 depicts the device after one or more gate structure etching processes were performed through the patterned masking layer 120 to remove portions of the gate structures 106 exposed by the openings 121. This process forms a recess 106X in exposed portions of the gate structures 106 wherein the recesses 106X have a lowermost surface 106R that is positioned at a level that is below a level of the uppermost surface 106S of the initial gate structure 106. The amount of recessing of the gate structures 106 may vary depending upon the particular application. The recesses 106X expose an inner surface 110S of the upper portions 110X of the spacers 110B, 110C. In contrast to prior art methodologies, recessing the gate structures 106 provides ready access to the upper portions 110X of the spacers 110B, 110C that will subsequently be removed by etching. The methods disclosed herein provide a reliable means for removing desired portions of the spacers 110B, 110C even in situations where the lateral spacing between adjacent gates 104 continues to decrease as technology and device scaling advances. FIG. 5 includes a simplistic side view of a portion of the gate structure 106 of the gate 104B with the gate width (GW) direction of the device indicated. In effect, the etching of the gate structures 106 exposed by the openings 121 forms notches 113 in the gate structures 106 of the gates 104B, 104C while the remainder of the gate structures 106 were protected by the masking layer 120 during the recess etching process.

Figure 6:
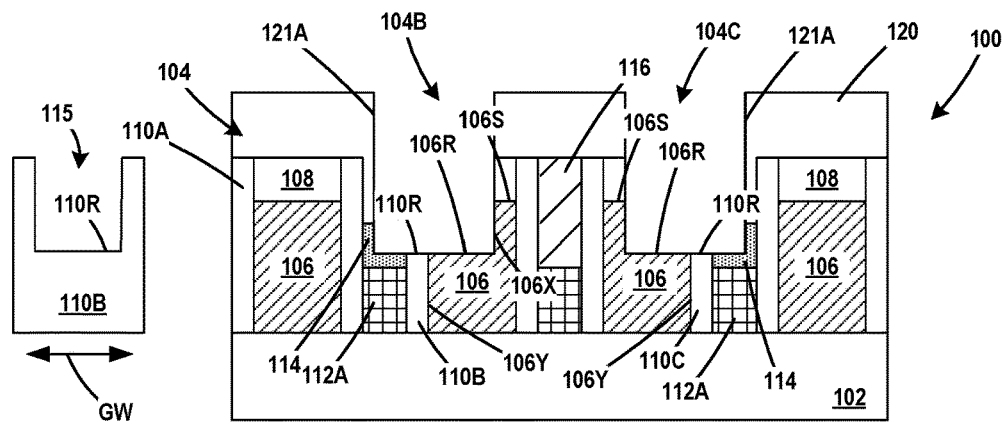

FIG. 6 depicts the IC product 100 after a spacer etching process were performed through the patterned masking layer 120 and the recesses 106X in the gates 106 to remove the upper portions 110X of the spacers 110B, 110C exposed by the openings 121. The vertical amount of the spacers 110B, 110C removed during this etching process may vary depending upon the particular application. After this spacer etching process, the spacers 110B, 110C have a recessed upper surface 110R. A simplistic side view of a portion of the spacer 110B positioned adjacent the gate structure is shown in FIG. 6 with the gate width (GW) direction of the device indicated. In effect, the etching of the spacers 110B, 110C forms notches 115 in the portions of the spacers 110B, 110C positioned adjacent the sidewalls 106Y of the gate structures 106 of the gates 104B, 104C while the remainder of the spacers 110B, 110C remain positioned around their respective gate structures 106. Since the inner surfaces 110S of the spacers 110B, 110C are exposed by the recesses 106X in the gate structures 106, the portions 110X may be readily removed while the masking layer 120 remains in position so at to protect the other portions of the spacers 110, including the other portions of the spacers 110B, 110C as well as the entirety of the spacers 110A and 110D. In the depicted example, the recessed surface 110R of the spacers 110B, 110C is depicted as being approximately level with the lowermost surfaces 106R of the recesses 106X in the initial gate structures 106. However, the relative heights or positions of the surfaces 110R, 106R and 106S may vary depending upon the particular application.

Figure 7:
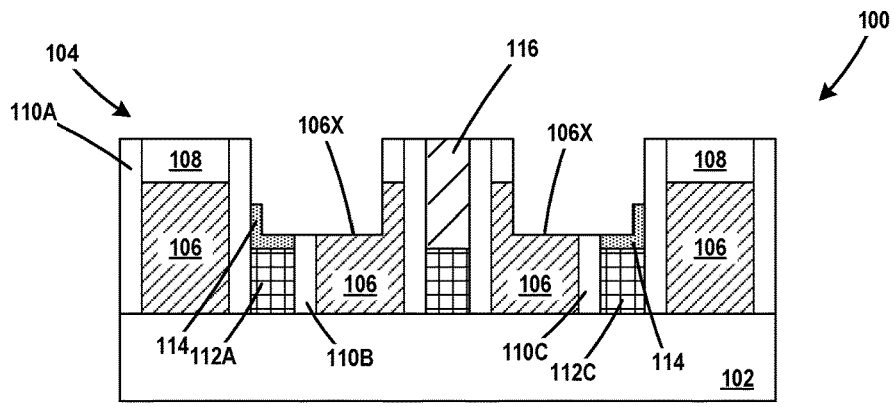

FIG. 7 depicts the IC product 100 after the patterned masking layer 120 was removed.

Figure 8:
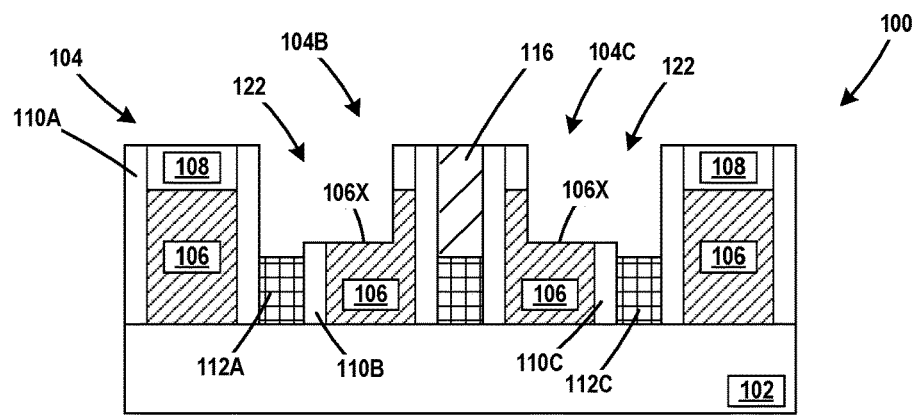
Figure 9:
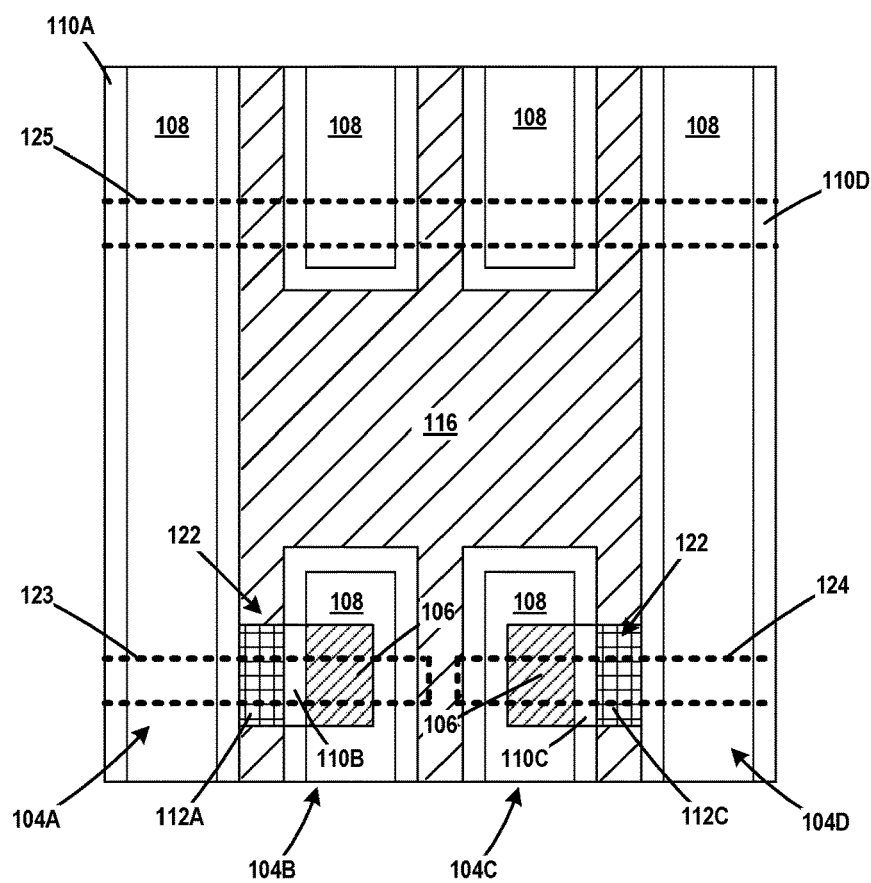

FIG. 8 (cross-sectional side view) and FIG. 9 (plan view) depict the IC product 100 after an etching process was performed to remove the remaining portions of the regions of amorphous silicon 114 selectively relative to the surrounding materials. This process exposes portions of the epi semiconductor regions 112A, 112C (i.e., portions of the adjacent source/drain regions) and defines a plurality of cross-couple contact openings 122. The openings 122 also expose the recess 106X in the gate structures 106 as well as the notched portions 115 of the recessed spacers 110B, 110C. Also depicted in FIG. 9 in dashed lines are illustrative fin structures 123, 124 and 125 for the various transistor devices. Of course, in the case where the epi semiconductor regions 112 are not formed on the IC product 100, portions of the underlying fin structures 123, 124 would be exposed by the openings 122.

Figure 10:
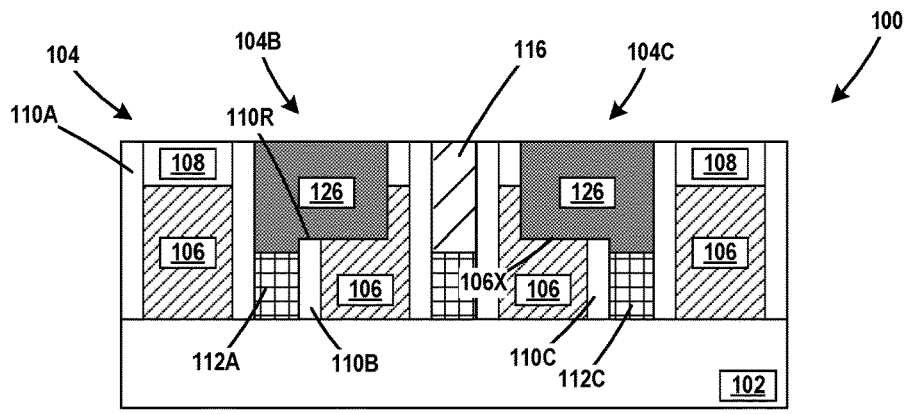
Figure 11:
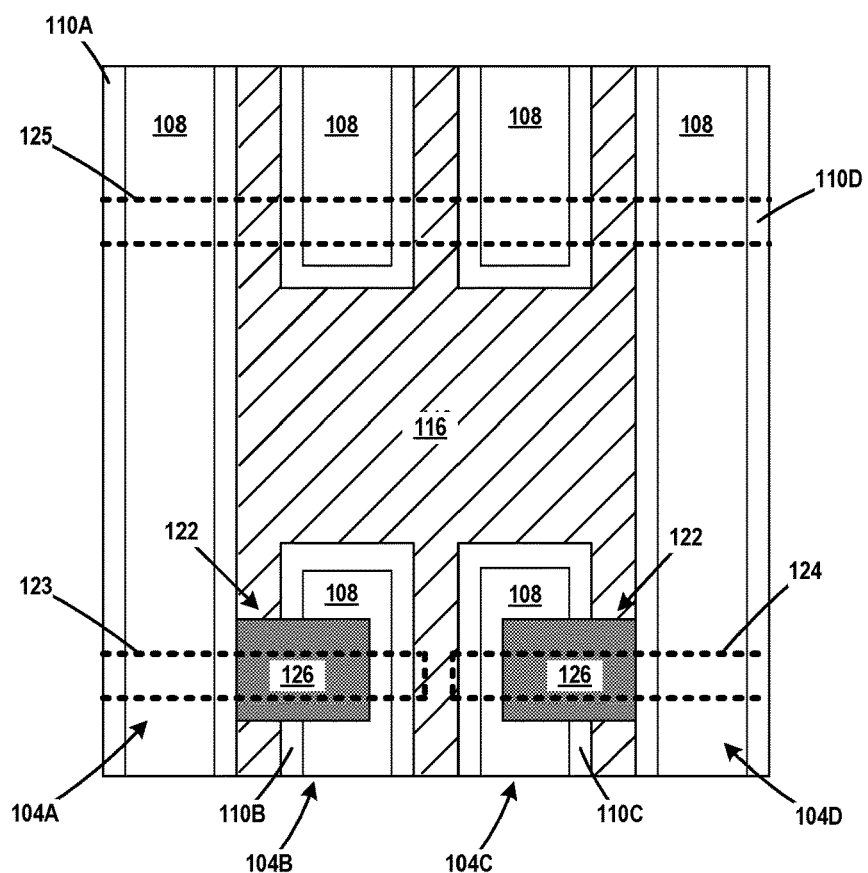

FIG. 10 (cross-sectional side view) and FIG. 11 (plan view) depict the IC product 100 after several process operations were performed to form conductive cross-coupled contacts 126, i.e., gate structure-to-source/drain conductive contact structures, in the contact openings 122. The gate structure-to-source/drain conductive contact structures 126 conductively couple the gate structures 106 of the gates 104B, 104C with the epi semiconductor regions 112A, 112C (i.e., source/drain regions), respectively. The conductive cross-coupled contacts 126 may be formed using any of a variety of techniques and materials. In one illustrative example, a conformal conductive liner layer (not separately shown), e.g., TiN, may be formed in the contact openings 122, followed by overfilling the remaining portions of the contact openings 122 with a bulk conductive material, such as tungsten. At that point, one or more CM' processes may be performed using the gate caps 108 as a polish stop so as to remove excess amounts of the conductive materials positioned outside of the contact openings 122. Note that the gate structure-to-source/drain conductive contact structures 126 extend into the recess 106X in the gate structures 106 and that the gate structure-to-source/drain conductive contact structures 126 are positioned above the recessed surfaces 110R of the spacers 110B, 110C.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   performing at least one first etching process to form a recess in a gate structure of a gate of a transistor device so as to expose an innermost surface of a portion of a sidewall spacer positioned adjacent a first sidewall of said gate structure, wherein an exposed portion of an outer surface of said sidewall spacer opposite of said exposed innermost surface of said sidewall spacer is exposed to said at least one first etching process; and
   performing at least one second etching process to remove at least part of said portion of said sidewall spacer with said exposed innermost surface, wherein said exposed portion of said outer surface of said sidewall spacer is further exposed to said at least one second etching process.

2. The method of claim 1, further comprising performing at least one third etching process to expose a portion of a source/drain region positioned adjacent said gate so as to define a contact opening that exposes at least said exposed portion of said source/drain region and said recess in said gate structure.

3. The method of claim 2 further comprising forming a gate structure-to-source/drain conductive contact structure in said contact opening.

4. The method of claim 1, wherein, prior to performing said at least one first etching process the method further comprises forming a patterned masking layer above said gate and a source/drain region positioned adjacent said gate, wherein said patterned masking layer comprises an opening that is positioned above a portion of said sidewall spacer, at least a portion of a gate cap positioned above said gate structure and at least a portion of said source/drain region, wherein said patterned masking layer covers other portions of said sidewall spacer, said gate cap and said source/drain region that are not located under said opening.

5. The method of claim 4, wherein performing said at least one first etching process comprises:
   performing a gate cap etching process through said opening in said patterned masking layer to remove at least a portion of said gate cap positioned under said opening so as to expose at least a portion of said gate structure; and performing at least one gate structure etching process through said opening in said patterned masking layer to remove at least a portion of said gate structure positioned under said opening and form said recess in said gate structure.

6. The method of claim 5, wherein performing said at least one second etching process comprises performing a spacer etching process through said opening in said patterned masking layer and said recess to remove at least a vertical portion of said portion of said sidewall spacer positioned under said opening.

7. The method of claim 6, further comprising:
removing said patterned masking layer; and
performing at least one third etching process to expose a portion of said source/drain region positioned adjacent said gate so as to define a contact opening that exposes at least said exposed portion of said source/drain region and said recess in said gate structure.

8. The method of claim 7, further comprising forming a gate structure-to-source/drain conductive contact structure in said contact opening.

9. The method of claim 1, wherein said transistor device is a FinFET transistor device that is part of an SRAM cell and wherein said source/drain region comprises an epi semiconductor material.

10. The method of claim 1, wherein performing said at least one first etching process to form said recess in said gate structure comprises performing said at least one first etching process to form said recess, wherein said recess comprises a lowermost surface that is at a level that is below a level of an uppermost surface of said gate structure.

11. A method, comprising:
forming a gate above a semiconductor substrate, said gate comprising a gate structure, a gate cap positioned above said gate structure and a sidewall spacer positioned adjacent sidewalls of said gate structure, wherein said sidewall spacer has an innermost surface that is positioned adjacent said gate structure;
forming an epi semiconductor material adjacent said gate;
forming a patterned masking layer above said semiconductor substrate, said patterned masking layer having an opening that is positioned above a portion of said sidewall spacer on a first sidewall of said gate structure, at least a portion of said gate cap and at least a portion of said epi semiconductor material, wherein said patterned masking layer covers other portions of said sidewall spacer, said gate cap and said epi semiconductor material that are not located under said opening;
performing at least one first etching process through said opening in said patterned masking layer to remove at least a portion of said gate cap positioned under said opening so as to expose at least a portion of said gate structure, wherein an exposed portion of an outer surface of said sidewall spacer is exposed to said at least one first etching process;
performing at least one second etching process through said opening in said patterned masking layer to remove at least a portion of said gate structure and define a recess in said gate structure that exposes a portion of said innermost surface of said sidewall spacer opposite of said exposed portion of said outer surface of said sidewall spacer, wherein said exposed portion of said outer surface of said sidewall spacer is exposed to said at least one second etching process; and
after performing said at least one second etching process, performing at least one third etching process through said opening in said patterned masking layer and said recess to remove a vertical portion of said sidewall spacer, wherein said exposed portion of said innermost surface of said sidewall spacer and said exposed portion of said outer surface of said sidewall spacer opposite of said exposed portion of said innermost surface are both exposed to said at least one third etching process.

12. The method of claim 11, further comprising:
removing said patterned masking layer; and
performing at least one fourth etching process to expose a portion of said epi semiconductor material so as to define a contact opening that exposes at least said exposed portion of said epi semiconductor material and said recess in said gate structure.

13. The method of claim 12, further comprising forming a gate structure-to-source/drain conductive contact structure in said contact opening.

14. The method of claim 11, further comprising performing at least one fourth etching process through said opening in said patterned masking layer to expose said outer surface portion of said sidewall spacer.

15. The method of claim 1, further comprising performing at least one third etching process to expose said outer surface portion of said sidewall spacer.

16. A method, comprising:
forming a gate above a semiconductor substrate, said gate comprising a gate structures gate cap positioned above said gate structure, and a sidewall spacer positioned adjacent sidewalls of said gate structure;
forming a sacrificial material above a source/drain region positioned adjacent to said gate;
performing at least one first etching process to form a first recess in said sacrificial material, said first recess exposing at least an outer surface portion of said sidewall spacer;
performing at least one second etching process to remove at least a portion of said gate cap so as to expose an upper surface of said gate structure;
after performing said at least one second etching process to expose said upper surface of said gate structure, performing at least one third etching process to form a second recess in said gate structure, said second recess exposing at least an inner surface portion of said sidewall spacer; and
after forming said first and second recesses, performing at least one fourth etching process to form a notch in said sidewall spacer, said notch exposing said first recess to said second recess.

17. The method of claim 16, wherein said outer surface portion of said sidewall spacer exposed by said first recess and said inner surface portion of said sidewall spacer exposed by said second recess are both exposed to said at least one third etching process.

18. The method of claim 16, wherein each of said at least one first etching process, said at least one second etching process, said at least one third etching process, and said at least one fourth etching process are performed through a same patterned masking layer.

19. The method of claim 16, further comprising:
after forming said notch in said sidewall spacer, performing a fifth etching process to define a contact opening by exposing a portion of said source/drain region; and
forming a conductive contact material in said contact opening, said conductive contact material contacting said gate structure in said second recess and said exposed portion of said source/drain region.

* * * * *

UNITED STATES PATENT AND TRADEMARK OFFICE
CERTIFICATE OF CORRECTION

PATENT NO. : 10,297,504 B2  
APPLICATION NO. : 15/670366  
DATED : May 21, 2019  
INVENTOR(S) : Hui Zang et al.

Page 1 of 1

It is certified that error appears in the above-identified patent and that said Letters Patent is hereby corrected as shown below:

Column 10, Line 27 (Claim 16, Line 3), change "structures gate" to -- structure, a gate --.

Signed and Sealed this  
Second Day of July, 2019

Andrei Iancu  
*Director of the United States Patent and Trademark Office*